United States Patent

Olson

[15] 3,697,778

[45] Oct. 10, 1972

[54] INTEGRATING CIRCUIT

[72] Inventor: Ronald A. Olson, Portland, Oreg.

[73] Assignee: Tektronix, Inc., Beaverton, Oreg.

[22] Filed: March 17, 1971

[21] Appl. No.: 125,183

[52] U.S. Cl. ...................307/229, 307/261, 328/127

[51] Int. Cl. ..............................................G06g 7/18

[58] Field of Search ......328/127, 151; 307/261, 237, 307/229

[56] References Cited

UNITED STATES PATENTS

| | | | |
|---|---|---|---|
| 3,543,080 | 11/1970 | Wuensch | 307/261 |
| 3,541,320 | 11/1970 | Beall | 328/151 |
| 3,405,286 | 10/1968 | Mudie | 307/261 |
| 3,139,537 | 6/1964 | Secretan | 328/27 |
| 3,386,039 | 5/1968 | Naive | 307/261 |

*Primary Examiner*—James W. Lawrence
*Assistant Examiner*—Harold A. Dixon
*Attorney*—Buckhorn, Blore, Klarquist & Sparkman

[57] ABSTRACT

An operational amplifier integrating circuit, which has a substantially constant voltage at the input of its amplifier and a pair of normally cut off diodes connected back to back in series between the input and output of such amplifier, integrates each waveform of a series of repeated waveforms. A control pulse applied between these diodes terminates the integration at the end of each waveform and integration starts again at the end of the control pulse. Each control pulse turns on one of the diodes to clamp the control pulse voltage at the amplifier output voltage plus the drop across such diode. The second diode is the emitter-base junction of a transistor having its emitter connected to the input of the amplifier. If the output voltage of the amplifier has a polarity with respect to the amplifier input voltage which is the same as that of the control pulse, the second diode also turns on and the integrating capacitor rapidly discharges through the emitter-base junction of the transistor to produce an output pulse at the collector of the transistor which varies with the difference between the input and output voltages of the amplifier at the end of the integration. A further circuit utilizes this pulse to deliver to the input of the amplifier during the next integration a substantially constant current which causes the output voltage of the amplifier at the end of such integration to be the same as its input voltage.

7 Claims, 4 Drawing Figures

RONALD A. OLSON
*INVENTOR*

BY

BUCKHORN, BLORE, KLARQUIST & SPARKMAN
*ATTORNEYS*

RONALD A. OLSON
*INVENTOR*

*BY*

*BUCKHORN, BLORE, KLARQUIST & SPARKMAN*
*ATTORNEYS*

INTEGRATING CIRCUIT

BACKGROUND OF THE INVENTION

Accurate electronic integrating circuits of the prior art, such as capacitive feedback operational amplifier integrating circuits for integrating repeated voltage waveforms, sum the increments of the area under the voltage curve of the function being integrated between the selected limits of integration. The summation is with respect to an axis set by the input voltage of the amplifier integration circuit. This may not be the axis which causes the integrated voltage curve to end at the same voltage at which such integrated voltage curve started. The result is that the voltage at the end of the integrated voltage curve may be substantially greater or smaller than the voltage at the beginning of such curve. In many cases it is desirable to derive an integrated voltage curve from the original voltage curve which has the same voltage at the beginning and end of the integrated voltage curve, i.e. at both of the limits of integration so that the integrated voltage curve will have the same form irrespective of its position or off set relative to the axis set by the integration circuit.

SUMMARY OF THE INVENTION

In accordance with the present invention, an integrating circuit is provided in which any difference between the integrated voltage at the end of the integration of one of a series of repeated voltage waveforms causes the integrated voltage curve of a subsequent waveform to end at the same voltage as the voltage at the beginning of such curve. In the specific embodiment of the invention disclosed, this difference voltage is employed to produce a substantially constant current which is delivered to the input of the amplifier of the integrating circuit during the integration of a subsequent waveform to cause the integrated voltage curve to end at the same voltage as the voltage at which this curve begins. The required current is provided by a simple circuit which operates in response to flow of discharge current from the integrating capacitor of an operational amplifier integrating circuit resulting from bringing the integration circuit back to a quiescent condition at the end of each integration in which the output voltage of the amplifier of such circuit equals its input voltage.

It is therefor an object of the invention to provide an improved integrating circuit for integrating successive waveforms of a series of repeated waveforms which causes the voltage at the end of each integrated voltage curve resulting from the integration of one of said waveforms to be substantially the same as the voltage at the beginning of such curve.

DESCRIPTION OF THE PREFERRED EMBODIMENT

Figure 1:
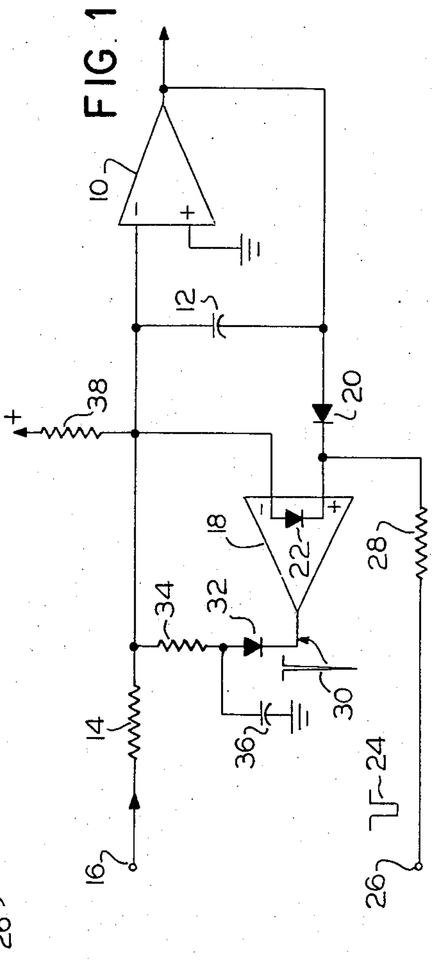
FIG. 1 is a simplified schematic diagram of a circuit in accordance with the present invention.

Referring to FIG. 1, the circuit in accordance with the present invention includes an integrating operational amplifier circuit having a high gain differential amplifier 10, an integrating capacitor 12 connected between the minus input and the output of the amplifier 10 and an input resistor 14 connected between the minus input of the amplifier 10 and an input terminal 16 for the voltage waveforms to be integrated. The plus input of the amplifier 10 is shown as being connected to ground so that the voltage of the minus input of such amplifier is maintained at substantially ground potential, but it will be understood that such plus input may be connected to any suitable source of fixed or adjustable potential to thereby set the minus input voltage as well as the plus input of the amplifier 10 substantially at such potential.

The circuit of FIG. 1 also includes another differential amplifier 18 which has its minus input connected to the minus input of the amplifier 10 and its plus input connected through a diode 20 to the output of the amplifier 10. Another diode 22 is also indicated as being a part of the amplifier 18 and as being connected between the minus and plus inputs of such amplifier. The diodes 20 and 22 are thus connected back to back in series between the output of the amplifier 10 and its minus input. In the embodiment shown in FIG. 1, these diodes have their cathodes connected together and a negative control pulse 24 may be delivered to the connection between these diodes from a control pulse input terminal 26 through a resistor 28.

The potential at the terminal 26 between control pulses 24 is sufficiently positive to cut off both of the diodes 20 and 22 and under these conditions, the capacitor 12 of the operational amplifier circuit is charged by any currents which flow through the resistor 14. The output voltage of the amplifier 10 varies directly with the charge on the capacitor 12. The time intervals during which the successive waveforms are integrated thus occur between control pulses 24.

Each control pulse 24 goes sufficiently negative with respect to any output voltage of the amplifier 10 which occurs during operation of the circuit to turn on the diode 20. Diode 20 clamps the negative potential applied to the plus input of the amplifier 18 to a voltage equal to the output voltage of the amplifier 10 plus the voltage drop across the diode 20. If, at this time, the output voltage of the amplifier 10 is more negative than the voltage at the negative input of this amplifier, the diode 22 also turns on. There is a charge on the capacitor 12 at this time because of the voltage difference between the output and minus input of the amplifier 10. This charge on the capacitor 12 discharges through the diode 22. Since the voltage at the terminal 26 is more negative than the voltage at the negative input of the amplifier 10, the capacitor discharge current flows from the capacitor 12 through the diode 22 and resistor 28 to the terminal 26. The output voltage of the amplifier 10 returns to its quiescent voltage, which is the same voltage as the voltage at the negative input of such amplifier. This terminates the integration at the end of a waveform being integrated. The discharge of the capacitor 12 occurs rapidly and at the beginning of the control pulse 24 and is in effect a positive input signal at the minus input of the amplifier 18 so as to produce a narrow negative pulse 30 at the output terminal of the amplifier 18.

The circuit of FIG. 1 also includes a diode 32 connected in series with the resistor 34 between the output of the amplifier 18 and the minus input of the amplifier 10. A capacitor 36 has one side connected to a terminal between the diode 32 and the resistor 34 and is shown as having its other side connected to ground. The negative pulse 30 produced at the output of the amplifier 18 is peak detected by the diode 32 and employed to charge the capacitor 36. The time constant of the resistor-capacitor circuit including the resistor 34 and capacitor 36 is sufficiently great that any charge on the capacitor 36 results in a substantially constant current flow through the resistor 34 from the capacitor 12 to the capacitor 36 during a subsequent integration of a waveform. This current is substantially proportional to any difference between the output voltage of the amplifier 10 and the voltage at the minus input of this amplifier at the beginning of the control pulse 24 which terminates the integration of a waveform. The result is to cause the integration of the next waveform to end at a voltage substantially the same as the voltage at the minus terminal of the amplifier 10, i.e. the quiescent output voltage of the amplifier 10 at which the integration of such waveform started.

The circuit of FIG. 1 also includes another resistor 38 connected between the source of positive potential and negative input of the amplifier 10. This delivers another constant current to the minus input of the amplifier 10 and serves to prevent the output voltage of the amplifier 10 from ever being positive with respect to the voltage at the minus input of this amplifier when the control pulse 24 is applied to the junction between the diodes 20 and 22. If the output of the amplifier 20 is at such a positive potential, the diode 22 will not be turned on by the control pulse. The output of the amplifier 10 will not be returned to its quiescent voltage equal to the voltage at the minus input of this amplifier so that the capacitor 12 will not be discharged and the circuit will cease to work correctly. Current through the resistor 38 also serves to keep the diode 22 turned on during the latter part of a control pulse 24 to retain the output voltage of the amplifier 10 the same as the voltage at the minus input of this amplifier so long as the pulse 24 persists.

Figure 2:
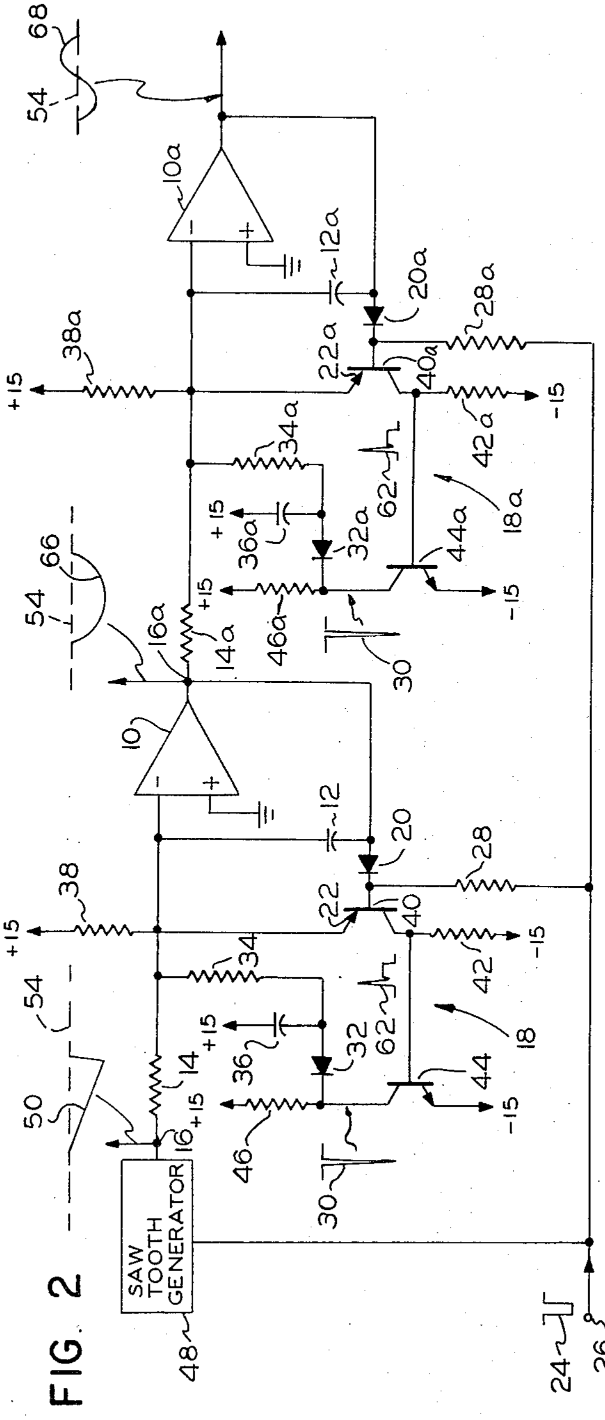
FIG. 2 is a schematic diagram showing two of the circuits of FIG. 1 connected in series with the circuits shown in more detail.

The more complete circuit diagram of FIG. 2 has two of the circuits of FIG. 1 connected in series and, furthermore, shows detailed circuitry of a suitable amplifier 18. The integrating circuit at the left of FIG. 2 has the same reference numerals applied to the elements of this circuit as are applied to the corresponding elements of FIG. 1 and the integrating circuit at the right of FIG. 2 also has the same reference characters followed by a small letter *a* for corresponding elements. As shown in FIG. 2, the amplifier 18 includes a PNP input transistor 40 of which the diode 22 also shown in FIG. 1 forms the emitter-base junction. Thus the resistor 28 has one end connected to the input terminal 26 for the control pulse 24 and its other end connected between diode 20 and the base of the transistor 40. A load resistor 42 is connected between the collector of the transistor 40 and a source of minus potential and the collector of this transistor is also connected to the base of an NPN transistor 44 having its emitter connected to a source of negative potential and its collector connected through a resistor 46 to a source of positive potential. A sawtooth generator 48, which for example may be triggered by the trailing edge of a control pulse 24 to produce a negative going sawtooth waveform 50 to be integrated, is also shown in FIG. 2. A sawtooth waveform has been chosen for illustration purposes and it will be apparent that any type of waveform from any other source may be applied to the integrating circuit of the present invention.

Figure 3:
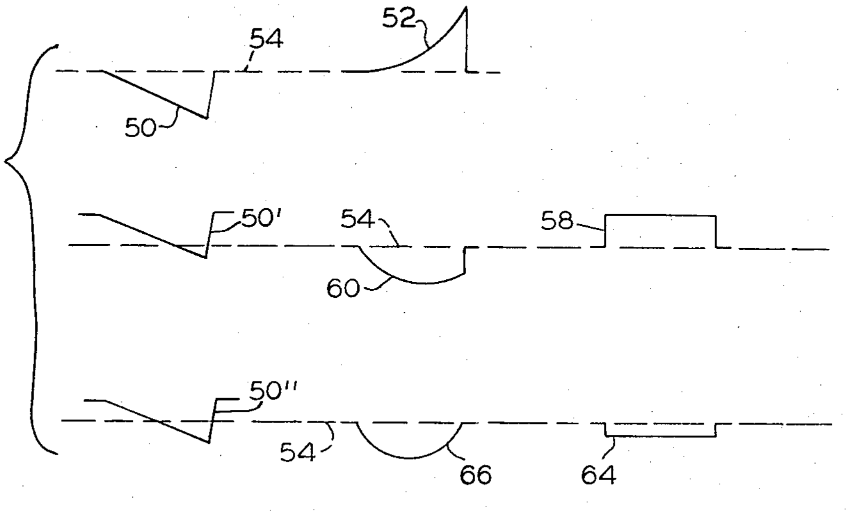
FIG. 3 is a graph showing curves illustrating the operation of the circuits of FIGS. 1 and 2.

Referring to FIG. 3, the negative going sawtooth input waveform 50 is also shown in such figure. Without the current inputs through the resistor 38 and resistor 34 of FIG. 2, the integrated output voltage waveform of the sawtooth input waveform 50 would be substantially that of the waveform 52 of FIG. 3 which is a portion of a parabola. Thus the integrated waveform at the end of the integration would have a voltage which is positive with respect to the axis 54 of integration determined by the substantially constant voltage at the minus input of the amplifier 10. This is not the desired waveform and furthermore the output of the integrating circuit at the left of FIG. 2 would not be returned to its quiescent condition by the next control pulse 24 as discussed with respect to FIG. 1. A constant current is, however, delivered to the capacitor 12 through the resistor 38 and this resistor and the positive potential to which it is connected is selected such that this current is sufficient to, in effect, move the waveform 50 in a positive direction relative to the axis of integration 54 to produce the waveform 50' also shown in FIG. 3. This can also be considered to be the addition of a constant positive voltage 58, indicated at the right of FIG. 3, to the waveform 50. The result of integrating the resultant voltage waveform 50' would be the integrated waveform 60 which ends at a voltage which is negative with respect to the axis 54.

The waveform 60 is also a portion of a parabola but is still not the desired waveform. As discussed with respect to FIG. 1, if the integrated waveform, such as the waveform 60, ends at a voltage which is negative with respect to the voltage at the minus input of the amplifier 10, i.e. with respect to the voltage of the axis of integration 54, the result will be the charging of the capacitor 36 and the delivery of a substantially constant current through the resistor 34 to the minus input of the amplifier 10.

When the diode 22 is turned on by the loading edge of the control pulse 24, the voltage at the collector of the transistor 40 has a form similar to that shown at 62 in FIG. 2. The discharge current of the capacitor 12 flowing through the emitter-base junction of the transistor 40 first produces a narrow positive voltage pulse at the collector of the transistor 40 followed by a less positive voltage due to continued current flow through the emitter-base junction from the positive potential source through the resistor 38. The narrow voltage pulse of the voltage 62 turns on the transistor 44 to produce the negative voltage pulse 30 at the collector of this transistor but the voltage at the collector of the transistor 40 following this narrow pulse, is insufficient to turn on the transistor 44. The result is the production of the narrow voltage pulse 30 only at the output of the transistor 44. The pulse 30 has a peak voltage substantially proportional to the charge on the capacitor 12 which in turn is proportional to the voltage difference between the output voltage of the amplifier 10 and the voltage at the minus input of this amplifier. The scale of the pulses 62 and 30 is very much greater than the other waveforms shown in FIG. 1, and the scale of the pulse 62 is greater than that of the pulse 30.

The resulting current flow through the resistor 34, in effect, moves the waveform 50' of FIG. 3 in a negative direction with respect to the axis of integration 54 to provide the sawtooth waveform 50'' which ends at the axis 54. This effective shifting of the waveform 50' with respect to the axis 56 to produce the waveform 50'' is, in effect, the adding of a constant negative voltage 64 indicated in FIG. 3 to the waveform 50'. The resulting integrated waveform 66 is a parabola which starts and ends at the axis 54 and is symmetrical about a vertical axis. It will be apparent that it is the effective shifting of the waveform 50 to the position of the waveform 50'', in which the waveform 50'' ends at the axis 54 set by the integration which causes the integrated waveform 66 to also end at the axis 54. Any slight variation of the output voltage at the end of the waveform 66 from the voltage of the axis of integration 54 representing the voltage of the minus input of the amplifier will result in a correction of the voltage across the capacitor 36 to correct such variation.

The output waveform 66 of the integrating circuit at the left of FIG. 2 can be delivered to an exactly similar integrating circuit at the right of this figure. Again the negative going waveform 66 would produce an integrated waveform which would end at a positive voltage with respect to the axis of integration 54 in the absence of the resistor **38*a* supplying a current from a positive potential source. Also the amplifier 18*a* furnishes a correcting current so that the integrated waveform ends as well as begins at the axis of integration 54**. The resulting waveform is an S-shaped cubic curve.

The integrated waveform 66 in the form of a parabola is useful, for example, in a pincushion correction circuit for a television raster and the S-shaped waveform 68 is useful, for example, for dynamic correction of the sweep speed in cases where the screen of a television tube or other cathode ray tube is flat or at least not sufficiently curved to be substantially concentric with the deflection point of the electron beam.

The circuits of FIGS. 1 and 2 will also integrate input waveforms which are predominantly positive going but the integrated waveform will tend to end at a substantially negative voltage with respect to the axis 54 and the effect of the resistor 38 connected to a positive potential is additive so that a greater load is placed on the correction circuit including the amplifier 18, capacitor 36 and resistor 34.

Figure 4:
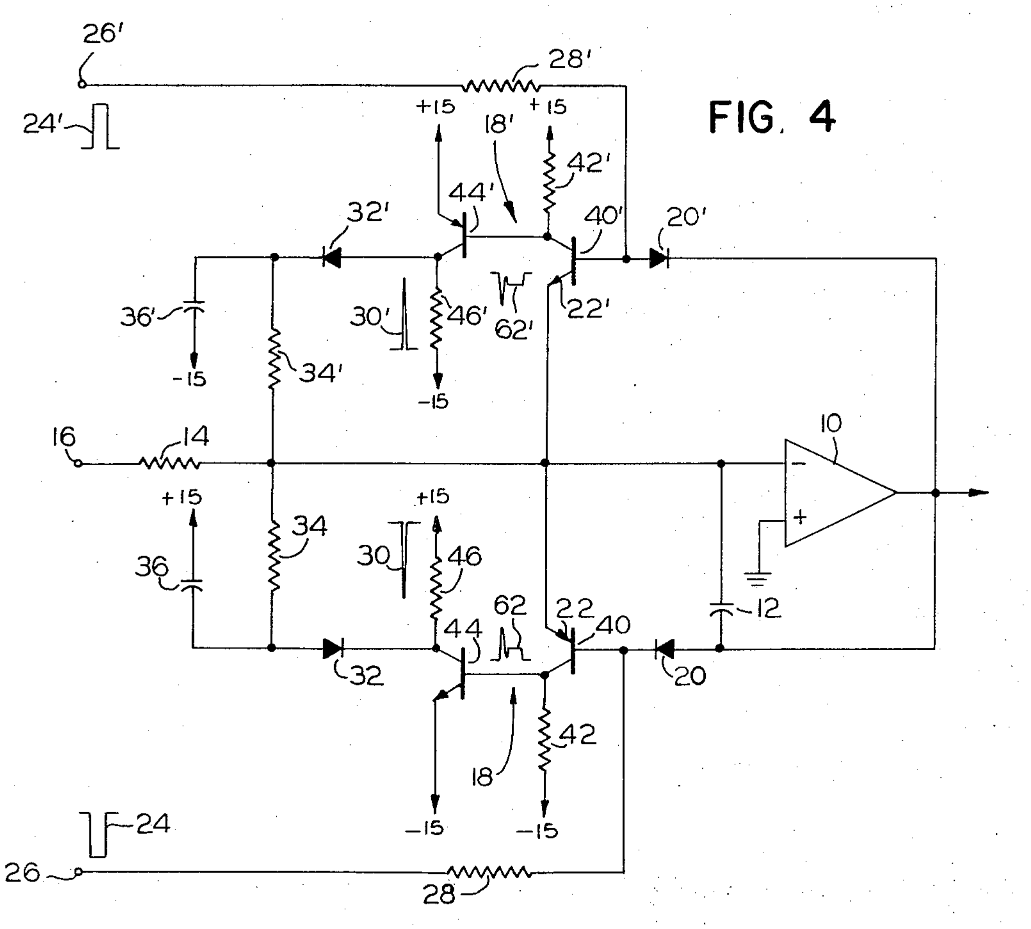
FIG. 4 is a schematic diagram showing a modified circuit.

FIG. 4 shows a circuit which will integrate any type of input waveform which can be predominantly on either side of the axis 54 of FIG. 3. The circuit forming the lower half of FIG. 4 is substantially the same as the circuits of FIGS. 1 and 2 and has the same reference numerals applied to corresponding elements. The circuit forming the upper half of FIG. 4 is the mirror image of the circuit forming the lower half except that all polarities have been reversed, PNP transistors have been substituted for NPN transistors and vice versa and also the diodes have been reversed.

The two circuits of FIG. 4 have a common input 16 for the repetitive waveform to be integrated and a common amplifier 10 and integrating capacitor 12. Also the resistor 38 has been eliminated since current for keeping the diode 22 of the transistor 40 is furnished to such diode through the diode 22' of the transistor 22' and vice versa during the latter part of push pull control pulses 24 and 24' supplied to the control pulse input terminals 26 and 26', respectively.

If the waveform being integrated tends to result in the integrated waveform ending at a negative voltage with respect to the axis of integration 54 of FIG. 3, the correction circuit including the transistor 40 will furnish a correction voltage to cause the succeeding integrated waveform to end at the axis 54. Thus the capacitor 12 will discharge through the emitter-base junction 22 of the transistor 40 to cause charging of the capacitor 36. On the other hand, if the waveform being integrated is such as to cause the integrated waveform to end at a positive voltage with respect to the axis 54, the capacitor 12 will discharge through the emitter-base junction 22' of the transistor 40' to cause the correction circuit associated with this transistor to supply the required correction current for the next integration from the capacitor 36'. During the latter part of the control pulses 24 and 24', the emitter-base junction by both transistors 40 and 40' will be turned on sufficient to hold the output voltage of the amplifier 10 at its quiescent value substantially equal to the voltage at the minus input of such amplifier.

Other uses for the integrated waveforms produced by the integrating circuits of the present invention include corrections of both deflection circuits for magnetically deflected cathode ray tubes and correction of convergence waveforms for multibeam tubes used in color television.

I claim:

1. An integration circuit for successively integrating the waveforms of a series of repeated waveforms, which comprises:

integrating means for said waveforms providing an axis of integration for said waveforms;

control means for starting said integrating means at a selected point on each of said waveforms to start an integrated waveform at said axis and stopping said integrating at the end of an integrating period to produce an integrated waveform during said period;

means responsive to a difference voltage between said axis and the voltage of the integrated waveform at the end of said integrating period for effectively shifting the waveforms being integrated relative to said axis of integration to cause the voltage of the integrated waveform at the end of said integration of a subsequent waveform to be substantially the same as the voltage of the integrated waveform at the beginning of said integration of said subsequent waveform.

2. The integrating circuit of claim 1, in which;

said integrating means includes amplifier means having a substantially constant input voltage which determines said axis of integration.

3. The integrating circuit of claim 2, in which;

said integrating means is an operational amplifier integrating means having an integrating capacitor and providing an output voltage at the beginning of said integration which is the same as the input voltage of said amplifier means;

and said means responsive to said difference voltage delivers to said capacitor during the integration of said subsequent waveform a substantially constant current causing the output voltage of said operational amplifier means at the end of said integration of said subsequent waveform to be substantially the same as said input voltage.

4. The integrating circuit of claim 3, in which;

said control means includes a pair of diodes connected back to back in series between the input and output of said amplifier means and one of said diodes is the emitter-base junction of a transistor having its emitter connected to the input of said amplifier means;

and said control means includes means for delivering a control pulse to the connection between said diodes having a polarity in a direction turning on both said diodes, if there is a difference voltage between the input and output voltages of said amplifier means and said output voltage has the same polarity with respect to said input voltage as said control pulse, to thereby discharge any charge on said capacitor through said one diode and produce an output pulse at the collector of said transistor which varies with said difference voltage;

and said means responsive to said output pulse for producing said substantially constant current.

5. The integrating circuit of claim 4, in which; said integrating circuit has a second control means connected in parallel with the first mentioned control means and said two control means are constructed to have voltages of opposite polarity applied thereto so that one or the other of the control means will deliver a substantially constant current to the input of said amplifier means which will cause the output voltage of the amplifier means at the end of the integration of said subsequent waveform to be substantially the same as said input voltage irrespective of the polarity of said output voltage at the end of the integration of a previous waveform.

6. The integrating circuit of claim 4, in which; said means responsive to said output pulse contains means for amplifying and reversing the polarity of said output pulse and charging a capacitor and means for discharging the last named capacitor through a resistor connected to the input of said amplifier means.

7. The integrating circuit of claim 6, in which; said integrating circuit contain means for preventing said output voltage of said amplifier means from having a polarity with respect to said input voltage which is opposite to said control pulse.

* * * * *